(12) United States Patent
Cobb et al.

(10) Patent No.: US 7,073,162 B2
(45) Date of Patent: Jul. 4, 2006

(54) SITE CONTROL FOR OPC

(75) Inventors: Nicolas B. Cobb, Sunnyvale, CA (US); Eugene Miloslavsky, Sunnyvale, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 107 days.

(21) Appl. No.: 10/698,596

(22) Filed: Oct. 31, 2003

(65) Prior Publication Data

US 2005/0097501 A1   May 5, 2005

(51) Int. Cl.
    *G06F 17/50* (2006.01)

(52) U.S. Cl. ............................. 716/20; 716/19; 716/21; 430/5

(58) Field of Classification Search ............ 716/19–21; 703/13; 430/5; 250/492.22
    See application file for complete search history.

(56) References Cited

U.S. PATENT DOCUMENTS

| | | |
|---|---|---|
| 4,762,396 A | 8/1988 | Dumant et al. |
| 5,502,654 A | 3/1996 | Sawahata |
| 5,655,110 A | 8/1997 | Krivokapic et al. |
| 5,723,233 A | 3/1998 | Garza et al. |
| 5,825,647 A | 10/1998 | Tsudaka |
| 5,879,844 A | 3/1999 | Yamamoto et al. |
| 6,016,357 A | 1/2000 | Neary et al. |
| 6,049,660 A | 4/2000 | Ahn et al. |
| 6,077,310 A | 6/2000 | Yamamoto et al. |
| 6,120,952 A | 9/2000 | Pierrat et al. |
| 6,128,067 A | 10/2000 | Hashimoto |
| 6,187,483 B1 | 2/2001 | Capodieci et al. |
| 6,243,855 B1 | 6/2001 | Kobayashi et al. |
| 6,249,904 B1 | 6/2001 | Cobb |
| 6,263,299 B1 | 7/2001 | Aleshin et al. |
| 6,269,472 B1 | 7/2001 | Garza et al. |
| 6,301,697 B1 | 10/2001 | Cobb |
| 6,370,679 B1 | 4/2002 | Chang et al. |
| 6,425,117 B1 | 7/2002 | Pasch et al. |
| 6,453,452 B1 | 9/2002 | Chang et al. |
| 6,453,457 B1 | 9/2002 | Pierrat et al. |
| 6,467,076 B1 | 10/2002 | Cobb |
| 6,499,003 B1 | 12/2002 | Jones et al. |

(Continued)

FOREIGN PATENT DOCUMENTS

JP            09319067 A     12/1997

(Continued)

OTHER PUBLICATIONS

Cobb, N., and Y. Granik, "Model-Based OPC Using the MEEF Matrix," *Proceedings of SPIE, vol. 4889: 22nd Annual BACUS Symposium on Photomask Technology*, Monterey, Calif., Sep. 30-Oct. 4, 2002, p. 147.

(Continued)

*Primary Examiner*—Vuthe Siek
(74) *Attorney, Agent, or Firm*—Christensen O'Connor Johnson Kindness PLLC

(57) ABSTRACT

A method for processing objects to be created via photolithography. Each object to be created is defined as a polygon that is fragmented into a number of edge segments that extend around the perimeter of the polygon. At least some of the edge segments have an associated control site where the edge placement error for the edge segment is to be minimal. A smoothing filter is applied to the polygon to identify those control sites that may cause an OPC tool to produce erroneous results. The identified control sites are moved and/or eliminated from the polygon, and polygon and the adjusted control sites are supplied to an OPC tool.

17 Claims, 6 Drawing Sheets

U.S. PATENT DOCUMENTS

| | | | |
|---|---|---|---|
| 6,643,616 B1 * | 11/2003 | Granik et al. | 703/13 |
| 6,928,634 B1 | 8/2005 | Granik et al. | |
| 2004/0088149 A1 * | 5/2004 | Cobb | 703/13 |

FOREIGN PATENT DOCUMENTS

| | | |
|---|---|---|
| WO | WO 01/65315 A2 | 9/2001 |

OTHER PUBLICATIONS

Cobb, N., and A. Zakhor, "Experimental Results on Optical Proximity Correction With Variable Threshold Resist Model," *Proceedings of SPIE, vol. 3051: Symposium on Optical Microlithography X*, Santa Clara, Calif., Mar. 10-14, 1997, pp. 458-468.

Cobb, N., and A. Zakhor, "Fast, Low-Complexity Mask Design," *Proceedings of SPIE, vol. 2440: Symposium on Optical/Laser Microlithography VIII*, Santa Clara, Calif., Feb. 22-24, 1995, pp. 313-327.

Cobb, N., and A. Zakhor, "Fast Sparse Aerial Image Calculation for OPC," *Proceedings of SPIE, vol. 2621: 15th Annual BACUS Symposium on Photomask Technology and Management*, Santa Clara, Calif., Sep. 20-22, 1995, pp. 534-545.

Cobb, N., and A. Zakhor, "Large Area Phase-Shift Mask Design," *Proceedings of SPIE, vol. 2197: Symposium on Optical/Laser Microlithography VII*, San Jose, Calif., Mar. 2-4, 1994, pp. 348-360.

Cobb., N., et al., "Mathematical and CAD Framework for Proximity Correction," *Proceedings of SPIE, vol. 2726: Symposium on Optical Microlithography IX*, Santa Clara, Calif., Mar. 13-15, 1996, pp. 208-222.

Cobb, N., and Y. Granik, "Using OPC to Optimize for Image Slope and Improve Process Window," (Nov. 20, 2002), *Proceedings of SPIE, vol. 5130: Photomask Japan*, Yokohama, Japan, Apr. 16-18, 2003, p. 42.

Granik, Y., "Generalized MEEF Theory," *Interface 2001*, Nov. 2001.

Granik, Y., and N. Cobb, "MEEF as a Matrix," *Proceedings of SPIE, vol. 4562: 21st Annual BACUS Symposium on Photomask Technology*, Monterey, Calif., Oct. 2-5, 2001, pp. 980-991.

Granik, Y., and N. Cobb, "Two-Dimensional G-Meef Theory and Applications," *Proceedings of SPIE, vol. 4754: Symposium on Photomask and Next-Generation Lithography Mask Technology IX*, Yokohama, Japan, Apr. 23-25, 2002, pp. 146-155.

Maurer, W., et al., "Process Proximity Correction Using an Automated Software Tool," *Proceedings of SPIE, vol. 3334: Optical Microlithography XI*, Santa Clara, Calif., Feb. 22-27, 1998, pp. 245-253.

Maurer, W., et al., "Evaluation of a Fast and Flexible OPC Package: OPTISSIMO," *Proceedings of SPIE, vol. 2884: 16th Annual Symposium on Photomask Technology and Management*, Redwood City, Calif., Sep. 18-20, 1996, pp. 412-418.

Ohnuma, H., et al., "Lithography Computer Aided Design Technology for Embedded Memory in Logic," *Japanese Journal of Applied Physics 37(12B)*:6686-6688, Dec. 1998.

\* cited by examiner

SITE CONTROL FOR OPC

FIELD OF THE INVENTION

The present invention relates to layout verification methods in general, and in particular to methods for enhancing the fidelity of objects to be created with a photolithographic process.

BACKGROUND OF THE INVENTION

In conventional photolithographic processing, objects are created on a semiconductor wafer by exposing the wafer with light that is passed through a mask or reticle. The mask/reticle has patterns of opaque and clear areas that selectively expose light sensitive chemicals on the wafer. The chemicals are processed to selectively remove portions of a layer, thereby creating the desired structures on the wafer.

As the size of objects being created on a wafer approaches and becomes smaller than the wavelength of light used to expose the wafer, optical distortions can occur such that the pattern of objects defined by the mask or reticle will not match the pattern of objects that are created on the wafer. To improve the pattern fidelity, changes can be made to the mask/reticle patterns that compensate for the expected optical distortions. One common tool for adjusting the mask/reticle patterns is an optical and process control (OPC) tool such as the Calibre® software tools available from Mentor Graphics Corporation of Wilsonville, Oreg., the assignee of the present invention.

As will be appreciated by those skilled in the art, an OPC tool allows a computer to adjust the position of edge segments in polygons that define structures to be created in order to compensate for expected optical distortions. FIG. 1A illustrates a polygon 10 that is divided into a number of edge segments 12, 14, 16, 18, 20, 22, 24, and 26 that extend around the perimeter of the polygon. Each edge segment has a corresponding control site 30a–30h that defines where the edge placement error (EPE) for the corresponding segment should be minimal or zero, and where measurements of process parameters are made. In order to manufacture an object corresponding to the polygon 10 on a wafer, the fragmented polygon is supplied to an OPC software tool that adjusts the position of the edge segments or adds features such as hammerheads or serifs, etc., so that a simulation of the lithographic process indicates that an object will be faithfully created on a wafer (as represented by the curved line 36). In an ideal case, the curved line 36 passes through each of the control sites 30a–30h so that the edge placement error at each of the control sites 30a–30h is minimal.

In some cases, where certain features cannot or can barely be resolved with a particular lithographic process, the placement or presence of certain control sites in a polygon can cause the OPC tool to produce poor or unexpected results. FIG. 1B illustrates an example wherein an OPC tool attempts to adjust the position of the edge segments such that the edge placement error at each control site is minimized. However, because of lithographic process constraints, in order to minimize the edge placement error at the control sites 30a, 30b, 30c, 30d, 30e, 30g, and 30h, the OPC tool causes an object to be created (as represented by the curved line 37) that is far outside the boundaries of the polygon in the area of the control site 30f that is defined for the edge segment 22. Therefore, there is a need for a method of eliminating or adjusting the position of control sites in a fragmented polygon that will prevent or lessen the chance that an OPC tool will produce anomalous results.

SUMMARY OF THE INVENTION

To address the problems discussed above, the present invention is a method for preparing a file that defines one or more objects to be created photolithographically for the application of an optical and process control (OPC) tool. A file is received that defines one or more objects to be created on a wafer. Each object in the file is defined as a polygon, which is fragmented into a number of edge segments that extend around the perimeter of the polygon. Control sites are defined for the edge segments and a smoothing filter is applied to the fragmented polygons that simulates how the objects would be created on a wafer. From the simulation, an error is calculated for each control site. Using the calculated errors, the position and/or orientation of the control sites is adjusted or control sites are eliminated from a polygon prior to applying the OPC tool to the fragmented polygons.

In one embodiment, the smoothing filter is a low-pass filter such as a 2-dimensional Gaussian function, which is convolved with the fragmented polygons. The errors for each control site may be calculated by determining a distance between the control site and a predefined contour of the computed convolution, although error can also be calculated using other metrics such as the angle between the fragment and the contour of the computed convolution in the neighborhood of each control site.

The present invention also includes a file that has been processed for the application of an OPC in accordance with the method of the invention and a computer readable medium containing a sequence of programmed instructions that cause a processor to implement the method of the present invention.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 2A:
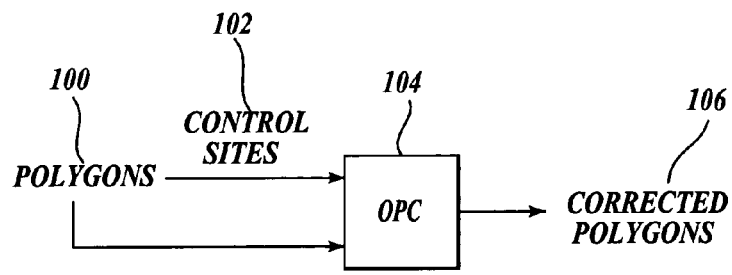
FIG. 2A illustrates a conventional method of applying an OPC tool to a layout structure.

FIG. 2A illustrates a conventional method for applying an optical and process control (OPC) tool to a file that defines objects to be created on a semiconductor wafer. The objects to be created are typically defined in the file as polygons 100 in a layout language such as GDSII or OASIS. The polygons are fragmented by a computer into a number of edge segments that extend around the perimeter of each polygon. In addition, control sites 102 are defined where the edge placement error (EPE) for each edge segment should be minimized or zero, as well as where measurements of simulated process parameters in the area of the edge segment are to be made. Control sites are generally oriented in a direction that is normal to the length of the edge segment. The initial position of the control sites can be made by rules, such as placing the control site at the middle of each edge segment. Also, rules may determine that some edge segments may be too short to have a control site.

The fragmented polygons 100 as well as the control sites 102 are supplied to an OPC 104 tool that adjusts the position of the edge segments and/or may add features such as hammerheads, serifs, etc., to the polygon in order to produce a series of corrected edge segments that are used to form a mask or reticle. The mask/reticle is then used to create the desired pattern of objects on a wafer by photolithographic processing. As indicated above, the presence or position of some control sites may cause the OPC tool to produce erroneous results.

Figure 2B:
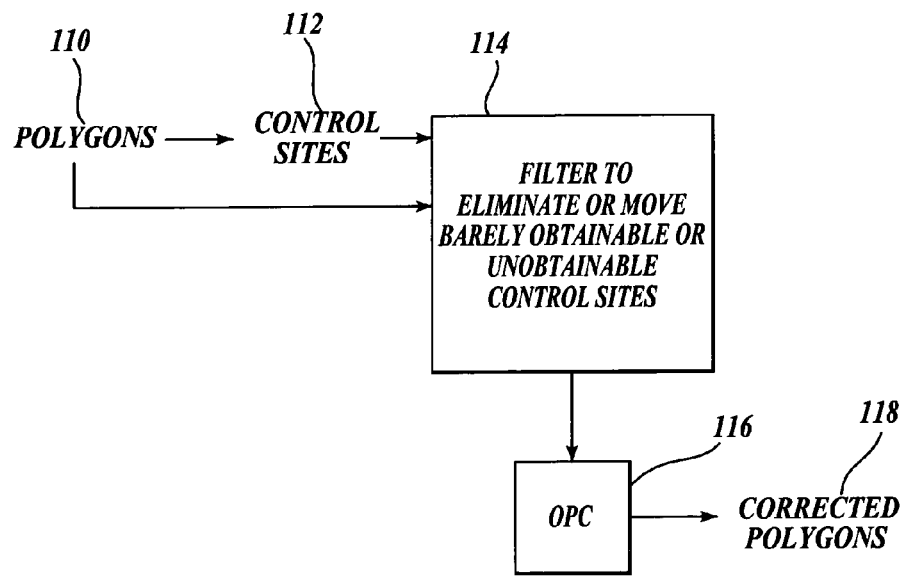
FIG. 2B illustrates a method for processing a layout prior to the application of an OPC tool in accordance with one embodiment of the present invention.

A process for conditioning a number of polygons that describe objects prior to the application of an OPC tool in accordance with an embodiment of the present invention is shown in FIG. 2B. A file defining a number of objects to be created on a semiconductor wafer is received, wherein each object to be created is defined in the file as a polygon 110. The polygons are initially fragmented into a number of edge segments and control sites 112 are defined for the edge segments. A smoothing filter 114 is then applied to the fragmented polygons. Control sites where the smoothed fragmented polygons differ from pre-smoothed fragmented polygon can be moved or eliminated. The difference between an original control site and the smoothed polygon can be computed via a number of metrics such as distance or angle between the original control site of an edge segment and the smoothed polygon. With the control sites moved or eliminated, the remaining control sites and edge segments are supplied to the OPC tool 116 that produces corrected polygons 118 for use in creating a mask or reticle. As will be explained in further detail below, the smoothing filter 114 operates to identify those control sites that may cause the OPC tool to produce erroneous or otherwise non-optimal results.

Figure 1A:
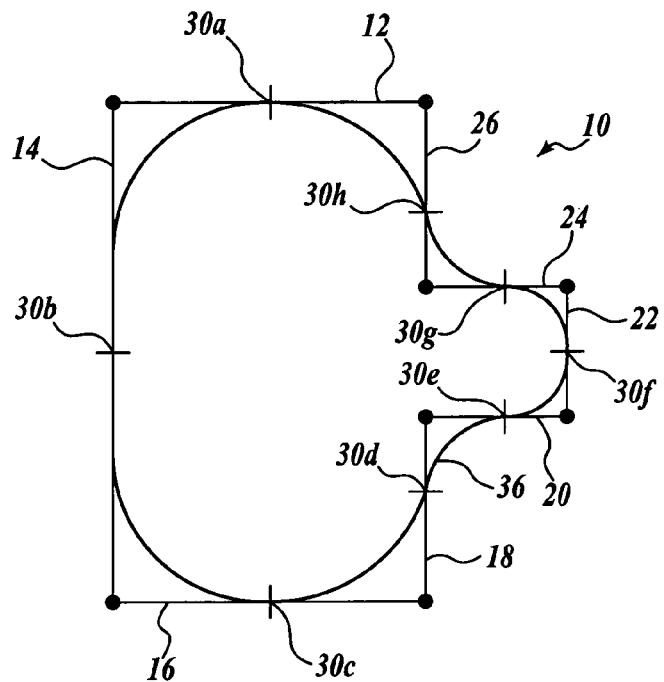
FIG. 1A illustrates a fragmented polygon having a number of control sites that create a corresponding object on a wafer.
Figure 1B:
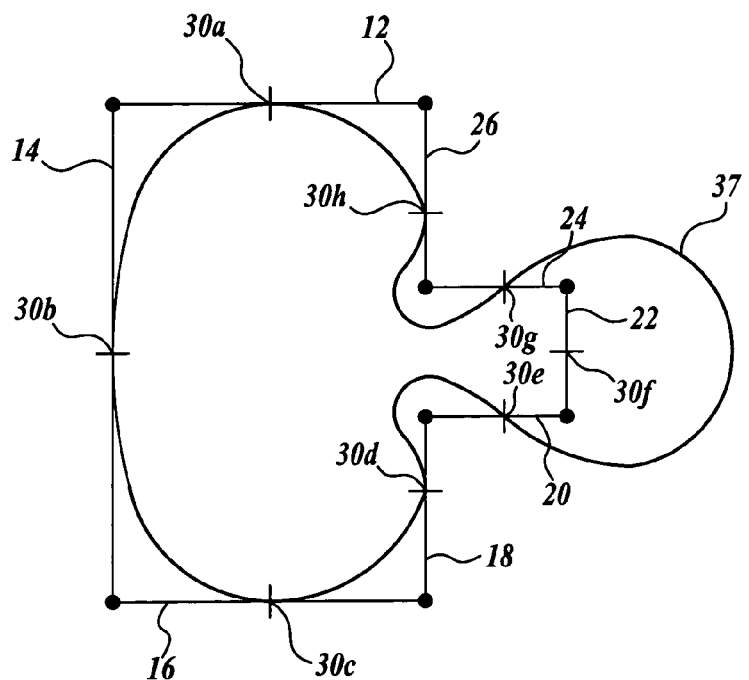
FIG. 1B illustrates how a fragmented polygon may produce a distorted object on a wafer by placing unobtainable control sites on the polygon.

FIG. 3 illustrates a sample polygon, such as the polygon 10 as shown in FIG. 1A, as a function in three dimensions that has a value of 1 within the boundary of polygon and a value of 0 everywhere outside the boundary of polygon. As described above, polygon 10 has a number of edge segments 12, 14, 16 . . . 26 that extend around the perimeter of the polygon. Each edge segment has a control site 30a–30h that is associated with the edge segment. A smoothing filter is applied to the fragmented polygon to identify those control sites where it is impossible or difficult to obtain a minimal edge placement error and that may cause the OPC tool to operate improperly.

Figure 3A:
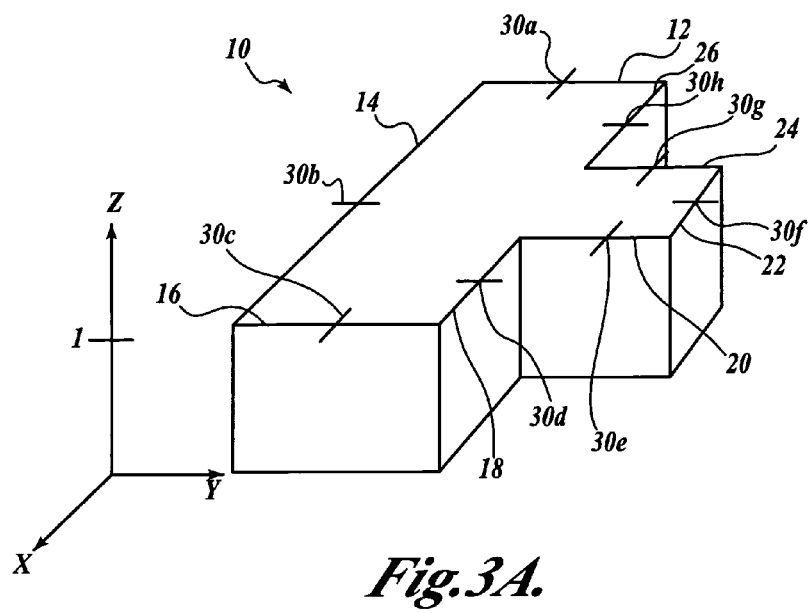
FIG. 3A illustrates how a sample polygon, that is defined to create an object on a wafer, can be viewed in three dimensions.
Figure 3B:
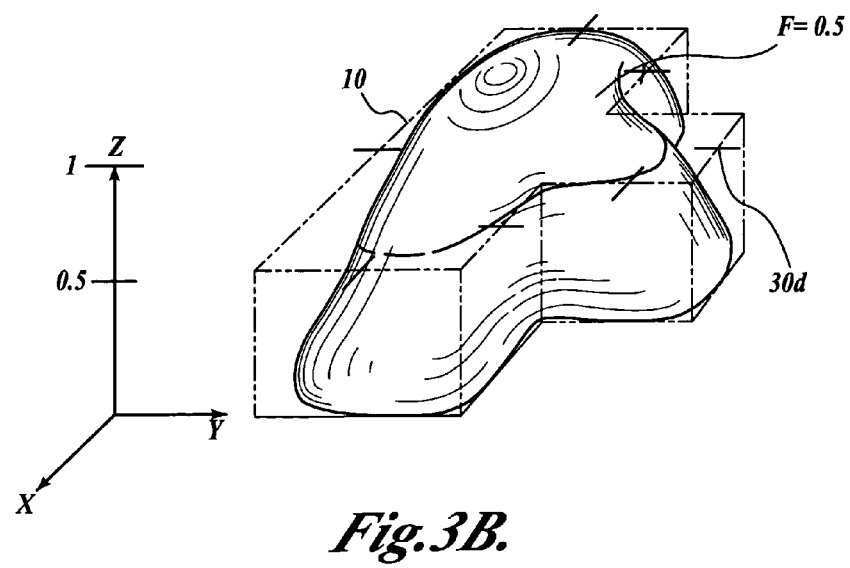
FIG. 3B illustrates the effect of applying a smoothing filter to the polygon shown in FIG. 3A.

FIG. 3B illustrates the effect of applying a two-dimensional smoothing filter to the polygon as shown in FIG. 3A. The smoothing filter produces a shape that is close to the shape of the polygon 10 but does not include the sharp edges or high frequency components that are defined at the corners of the polygon. A smoothed polygon shape in two dimensions can be generated by taking a contour of the three dimensional smoothed polygon shape at a predetermined threshold. If properly selected, the smoothing filter simulates how a manufacturing process will create an object on a wafer from a corresponding fragmented polygon.

In one embodiment of the invention, an error for each control site is determined by comparing the distance between the center of each control site and the closest point of the two-dimensional smoothed polygon contour. In another embodiment, an error for each control site is defined by the angle between the original site orientation that is normal to the length of the corresponding edge segment and a direction that is aligned with the gradient of the contour.

In one embodiment, the smoothing filter comprises a convolution of the fragmented polygon and a two-dimensional Gaussian function, wherein the standard deviation of the Gaussian function is selected to model the smoothing of a lithographic process. In one embodiment, the Gaussian function is selected to have a sigma such that 3 times sigma is less than the minimum mask feature width.

If we let P(x,y) be the two-dimensional function having the value of 1 inside the polygon and the value of 0 everywhere else, and G(x,y) be a normalized two-dimensional Gaussian function, then the two-dimensional smoothed polygon function, S(x,y), is the convolution of P(x,y) and G(x,y), which can be computed as $$S(x, y) = \sum_{i=-\infty}^{i=\infty} \sum_{j=-\infty}^{j=\infty} P(x-i, y-j)G(i, j)$$

In some areas, the filtered or smoothed polygon, expressed by the 0.5 threshold contour of the function S(x,y), will closely approximate the desired structure specified by an edge segment. In other areas, the filtered polygon suggests that the object created will not resemble the corresponding edge segment. As indicated above, the degree to which the simulation corresponds to the particular edge segment can be measured by the distance and angle variations between the control sites and the smoothed polygon. Those control sites having a large distance and/or angular variation can be eliminated, moved or reoriented.

With the control sites removed from the polygon that define locations where it is impossible or difficult to achieve a minimal edge placement error, the remaining control sites (with their position and/or orientation possibly adjusted) can be supplied to an OPC tool that optimizes the position of the edge segments in order to achieve a minimum edge placement error at each of the remaining control sites.

Figure 4:
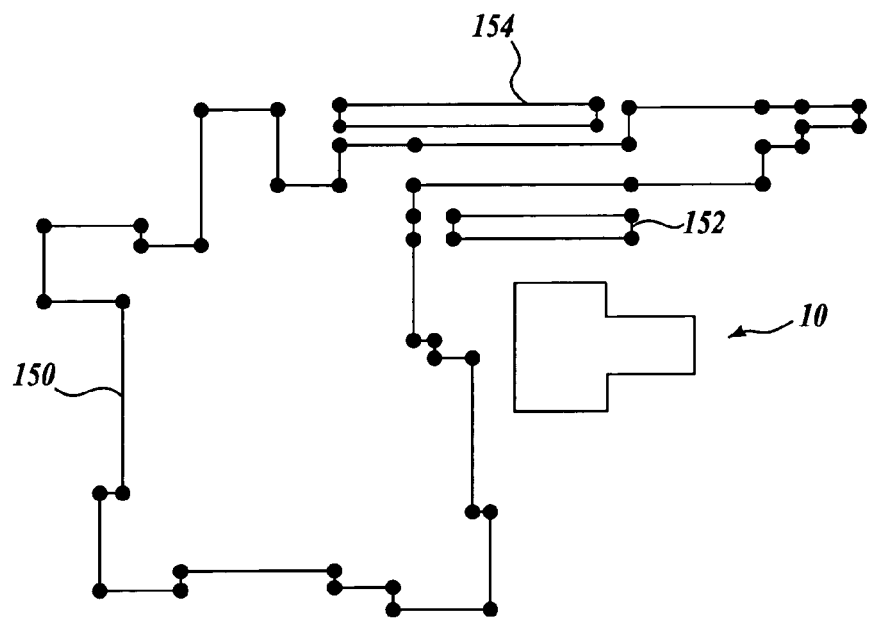
FIG. 4 illustrates another example of polygons that are defined to create objects on a wafer.

FIG. 4 shows another example of a polygon 150 and the polygon 10 that define objects to be created on a semiconductor wafer. Adjacent to the polygon 150 are subresolution assist features 152, 154 that are placed in the layout to aid the formation of objects corresponding to portions of the polygon 150. The subresolution assist features 152, 154 are too small to be resolved on a wafer.

Figure 5:
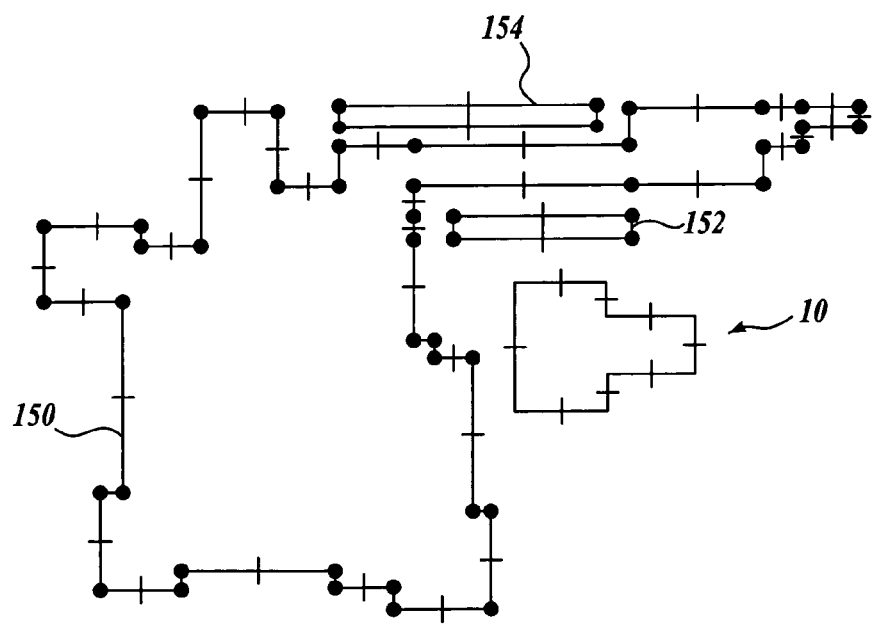
FIG. 5 shows the polygonals of FIG. 4 with control sites added.

FIG. 5 shows control sites placed in the edge segments of the polygons 150 and 10. As indicated, some edge segments such as those on the ends of the subresolution assist features 152, 154 may be too small to warrant a control site. A simple rule based on edge segment length can determine which segments should receive control sites and which should not.

Figure 6:
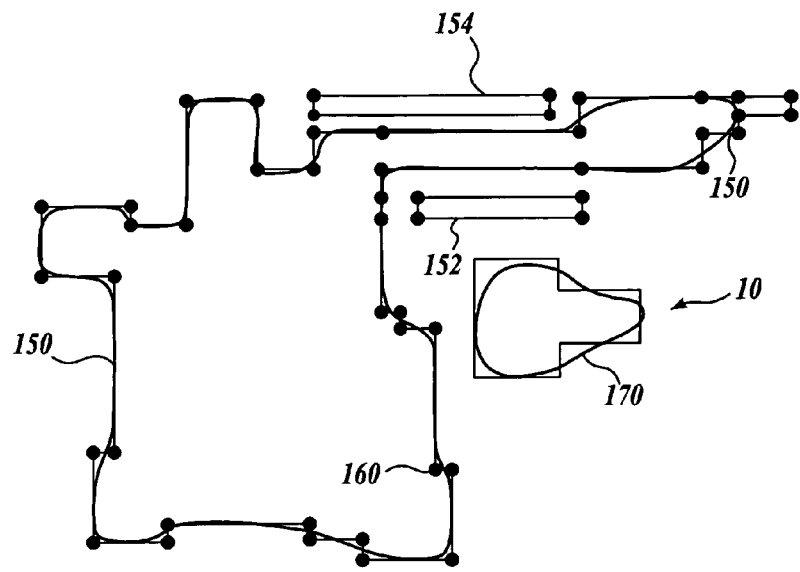
FIG. 6 illustrates the results of applying a smoothing filter to the polygons shown in FIG. 5.

FIG. 6 illustrates the 0.5 contour of the convolution of the polygons 150 and 10 with a Gaussian function as indicated by the curved lines 160 and 170. As can be seen, the curved line 160 does not extend into the subresolution features 152, 154 or narrow portions of the polygon 150. Similarly, the curved line 170 extends outside the boundaries of the polygon 10 at some points.

Figure 7:
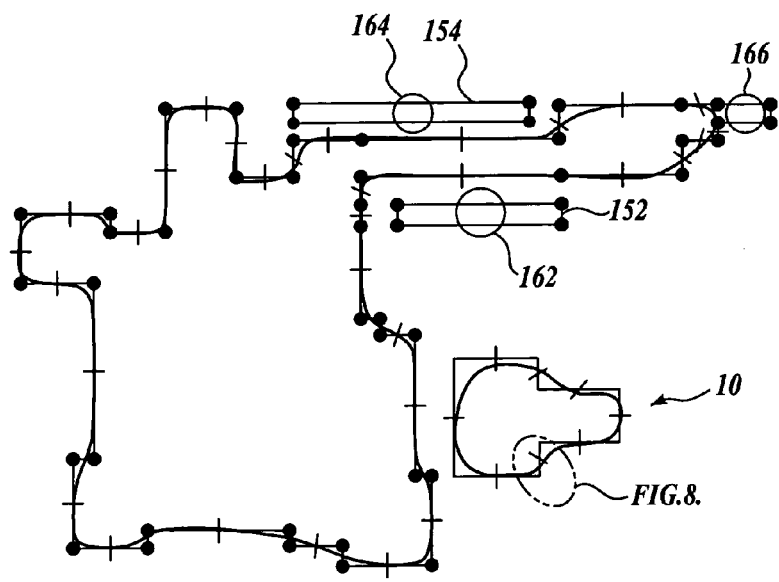
FIG. 7 shows the polygons of FIG. 5 with some control sites removed and others moved/rotated prior to the application of an OPC tool.

FIG. 7 illustrates how the control sites of the polygons 150 and 10 are adjusted by comparing the position of the original control sites with the smoothed polygon determined by the filter. Those sites having an error that is greater than a predefined maximum are removed from the polygon as indicated by the circled regions 162, 164 in the subresolution assist feature polygons 152, 154, and the narrow region 166 in the polygon 150. In addition, some control sites have been moved/rotated such that they are placed on the contour line and aligned with the gradient of the smoothed polygon. Repositioning the control sites and/or reorienting them on the smoothed polygon has been found to improve the results of the OPC tool that is applied to the remaining control sites in a polygon.

Figure 8:
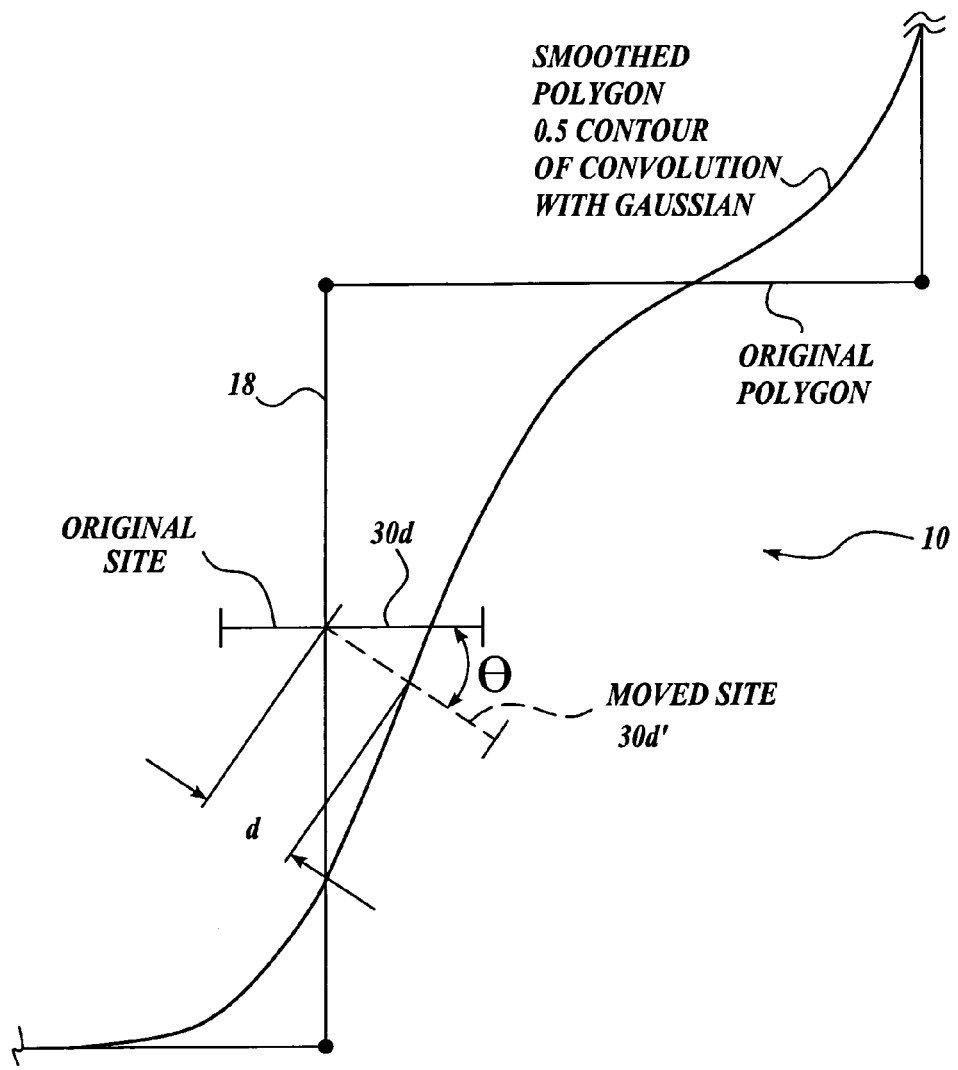
FIG. 8 shows in detail how a control site on a polygon is moved and rotated in accordance with one embodiment of the invention.

FIG. 8 shows in detail how a control site in the area of the edge segment 18 for the polygon 10 is repositioned and/or reoriented on the smoothed polygon prior to the application of an OPC tool. As indicated above, an error for each control site is determined by calculating a distance, d, between the center of the control site 30d and the closest point on a contour curve 170 having a predefined value. In one embodiment, the predefined value equals 0.5 of the normalized filtered polygon. Because each control site comprises a number of sample points arranged in a cross configuration, the computer can determine the distance, d, between the center sample point of the control site and the closest portion of the 0.5 contour line. In addition, the gradient of the 0.5 contour line is determined at this closest point. The angle θ between the orientation of the original control site 30d that is normal to the corresponding edge segment 18 and the angle of the gradient is also determined.

If the distance d or the angle θ is greater than a threshold, the control site can be eliminated from the polygon. If the control site is within a predefined maximum distance threshold to the contour curve or angle to the smoothed polygon curve is less than a maximum angle, then the position of the control site can be adjusted to be 30d' on the contour curve and/or the orientation of the control site can be adjusted to be aligned with the gradient of the smoothed polygon function. As will be appreciated, if the distance and/or angle difference between the control site and the smoothed polygon is negligible, then the original control site can remain unchanged.

Once the position/orientation of the control sites have been changed, the file defining the edge segments and position/orientation of the remaining control sites is passed to an OPC tool.

Although the described embodiment smoothes a polygon by convolving the polygon with a Gaussian function, it will be appreciated that other functions such as Tophat, triangle or Airy could be used to simulate a structure that will be created from a corresponding fractured polygon. Furthermore, although the present invention has been described with respect to a particular order of steps, it will be appreciated that the invention may be practiced with steps performed in other orders and still achieve the same result.

In practice, the present invention is encoded as a sequence of executable software instructions that are stored on a computer-readable medium or transmitted over a wired or wireless communication link. The instructions are executed by one or more processors in order to perform the method of processing polygons prior to the application of an OPC tool. The one or more processors may be located domestically or internationally to manipulate a polygon file prior to the application of an OPC tool. Therefore, the present invention includes a computer readable medium on which program instructions are stored for implementing the procedures of the site control invention as well as a file of polygons that has been prepared in accordance with the present invention.

The embodiments of the invention in which an exclusive property or priviledge is claimed are defined as follows:

1. A method of preparing a file that defines one or more objects to be created photolithographically for correction with an optical and process control (OPC) tool, comprising:
   receiving the file that defines the one or more objects to be created, each object being defined as a polygon in the file;
   fragmenting each polygon into a number of edge segments that extend around the perimeter of the polygon;
   defining a control site for at least some of the edge segments;
   applying a smoothing filter to one or more of the fragmented polygons, the smoothing filter simulating how objects would be created on a wafer from the one or more fragmented polygons;
   calculating an error for the control sites in the one or more fragmented polygons; and
   using the calculated errors to adjust the position and/or orientation of the control sites or to eliminate control sites from a polygon prior to applying the OPC tool to the polygons.

2. The method of claim 1, wherein the smoothing filter is a two-dimensional low pass filter.

3. The method of claim 1, wherein the smoothing filter is applied by convolving the one or more fragmented polygons with a Gaussian filter.

4. The method of claim 3, wherein the error for each control site is calculated by determining a distance between the control site and a predefined contour of the convolution.

5. The method of claim 4, wherein a control site is eliminated from a fragmented polygon if the distance exceeds a threshold.

6. The method of claim 4, wherein a control site is moved if the distance is less than a threshold.

7. The method of claim 3, wherein the error for each control site is calculated by determining a gradient of the convolution contour near the control site and comparing the orientation of the gradient with the orientation of the control site.

8. The method of claim 7, further comprising adjusting the orientation of a control site to be aligned with the gradient of the convolution result near the control site.

9. The method of claim 7, wherein a control site is eliminated if the angle between the control site and the gradient is greater than a threshold.

10. The method of claim 9, wherein the angle of the control site is measured with respect to a direction that is normal to a control site's corresponding edge segment.

11. A method of preparing a file that defines objects to be created with a photolithographic process for the application of an optical and process control (OPC) tool, comprising:

receiving a file that defines the objects to be created, each object being defined in the file as a polygon;

fragmenting each polygon into a number of edge segments that extend around the perimeter of the polygon;

defining a control site for at least some of the edge segments that defines where an edge placement error for the edge segment is determined;

identifying control sites defined for edge segments where it is difficult to obtain a minimum edge placement error; and moving or removing the identified control sites prior to the application of an OPC tool on the fragmented polygons.

12. The method of claim 11, wherein the control sites are identified by applying a smoothing filter to the fragmented polygons.

13. The method of claim 12, wherein the smoothing function is applied by convolving the fragmented polygons with a Gaussian filter.

14. The method of claim 11, wherein the control sites are identified by determining a distance between a control site and a predefined contour of a convolution of the fragmented polygons and a Gaussian filter.

15. The method of claim 11, wherein the control sites are identified by determining an angle between the control site and a gradient of the contour of a convolution of the fragmented polygons and a Gaussian filter.

16. A computer readable medium including a number of program instructions that are executable by one or more processors to perform any of the method claims 1–15.

17. A file that defines a number of features to be created by a lithographic process that has been processed according to any of the method claims 1–15.

* * * * *